US008182978B2

(12) United States Patent
Huang et al.

(10) Patent No.: US 8,182,978 B2
(45) Date of Patent: May 22, 2012

(54) DEVELOPABLE BOTTOM ANTIREFLECTIVE COATING COMPOSITIONS ESPECIALLY SUITABLE FOR ION IMPLANT APPLICATIONS

(75) Inventors: Wu-Song Huang, Brewster, NY (US); Libor Vyklicky, Yorktown Heights, NY (US); Pushkara Rao Varanasi, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 294 days.

(21) Appl. No.: 12/363,913

(22) Filed: Feb. 2, 2009

(65) Prior Publication Data

US 2010/0196825 A1     Aug. 5, 2010

(51) Int. Cl.
G03F 7/004   (2006.01)
G03F 7/09    (2006.01)
G03F 7/039   (2006.01)
G03F 7/20    (2006.01)

(52) U.S. Cl. ............... 430/271.1; 430/270.1; 430/273.1; 430/313; 430/315; 430/312; 430/314; 430/326; 430/323

(58) Field of Classification Search ........................ None
See application file for complete search history.

(56) References Cited

U.S. PATENT DOCUMENTS

| | | | |
|---|---|---|---|
| 6,329,117 B1 * | 12/2001 | Padmanaban et al. | 430/270.1 |
| 6,506,534 B1 * | 1/2003 | Nozaki et al. | 430/270.1 |
| 6,900,134 B1 | 5/2005 | Shih et al. | |
| 6,972,201 B1 | 12/2005 | Subramanian et al. | |
| 7,341,939 B2 | 3/2008 | Oweyang et al. | |
| 2005/0266354 A1 | 12/2005 | Li et al. | |
| 2007/0009830 A1 * | 1/2007 | Huang et al. | 430/270.1 |
| 2007/0117041 A1 | 5/2007 | Noelscher et al. | |
| 2008/0206690 A1 | 8/2008 | Kennedy et al. | |
| 2009/0214981 A1 * | 8/2009 | Halle et al. | 430/281.1 |

FOREIGN PATENT DOCUMENTS

| | | |
|---|---|---|
| WO | WO2004048458 | 6/2004 |
| WO | WO2005093513 | 10/2005 |
| WO | WO2007121456 A1 | 10/2007 |
| WO | WO2008049844 A1 | 5/2008 |

OTHER PUBLICATIONS

March, Jerry, "0-11 Hydrolysis of esters", Advanced Organic Chemistry; Reactions, Mechanisms, and Structure, second edition, McGraw-Hill Book Company, New York, N.Y., 1977, pp. 349-353. 3.*
Shao, Guerrero, Gu, "Wet—Developable Organic Anti-Reflective Coatings for Implant Layer Applications" Mar. 2004, pp. 1-9, Brewer Science, Inc., Rolla, MO; As presented at the SEMICON China 2004 SEMI Technology Symposium on Mar. 17, 2004, at the RiverFront Business Hotel, Pudong, Shanghai.*
"Aliphatic compounds", PAC, 1995, 67 1307, (GLossary of class names of organic compounds and reactivity intermediates based on structure (IUPAC recommendations 1995) on p. 1313 downloaded from http://goldbook.iupac.org/PDF/A00217.pdf on Mar. 14, 2011 one page.*
Katchalsky et al "Molecular Weight of Polyacrylic and POlymethacrylic Acid", Journal of POlymer Science, Feb. 1951, vol. VI, No. 2 pp. 145-154 obtained from http://onlinelibrary.wiley.com/doi/10.1002/pol.1951.120060202/abstract page on web.*
Semen et al, Macromolecules, vol. 2, No. 6, Nov.-Dec. 1969, pp. 570-575.*
PCT Application No. PCT/EP2010/050796, Filing Date: Jan. 25, 2010, PCT ISR and Written Opinion of the Internatinal Searching Authority.
Do, Pender, Lehmann, Mc Ardle, Gotlinsky, Mesawich, "Optimized filtration for reduced defectivity and improved dispense recipe in 193 nm BARC lithography", 2004, LSI Logic Corporation, Gresham, OR, paper to be published in SPIE no specifics given.
Houlihan, Dioses, Toukhy, Romano, Oberlander, Wu, Mullen, Krawicz, Lu, Neisser, "Second Generation Radiation Sensitive Developable Bottom Anti-Reflective Coatings (DBARC) and Implant Resists Aprroaches for 193 nm Lithography", 2007, pp. 1-8, AZ Electronic Materials, Somerville, NJ, SPIE, vol. 6519.
Houlihan, Dioses, Zhang, Oberlander, Krawicz, Vasanthan, Li, Wei, Lu, Neisser, "Second Generation Radiation Sensitive 193 nm Developable Bottom Anti Reflective Coatings (DBARC): Recent Results", 2008, pp. 1-7, AZ Electronic Materials, Somerville, NJ, SPIE, vol. 6923. online publication date Mar. 24, 2008. COnf date Feb. 25, 2008.
Johnson, "A Materials Perspective", Immersion ArF Lithography, 2004, Sumika Electronic Materials, Inc. Screen Lithography Breakfast Forum, SEMICON West 2004.
Meador, Beaman, Stroud, Lowes, Zhu, Guerrero, Mercado, Drain, "Dual-layer dye-filled developer-soluable BARCs for 193-nm lithography", 2008, pp. 1-11, Brewer Science, Inc., Rolla, MO., SPIe, vol. 6923, 69232w.
Neef, Thomas, "A novel 248-nm wet-developer BARC for trench applications", 2007, pp. 1-8, Brewer Science, Rolla, MO., SPIE vol. 6519, 65192Z.
"Anti-Reflective Coatings", pp. 1-7,Brewer Science, Inc Rolla MO., only date is date submitted Feb. 2, 2009. No identification as to where obtained.
"Photoresists Meet the 193 nm Milestone", pp. 1-6, Semiconductor International, 2005, http://www.semiconductor.net/index.asp?layout=articlePrint&articleID=.com.
"A new wet-developable BARC for 248-nm applications", pp. 1-5, http://www.semi.org.cn. smmchina/show_detail.aspx?id=518.com, date submitted Feb. 2, 2009 no other date given.
Mercado, Lowes, Washburn, Guerrero, "A novel approach to developer-soluble anti-reflective coatings for 248-nm lithography", 2007, Brewer Science, Inc. Rolla, MO., citation with intention to publish in SPIE. No publication date given.

(Continued)

*Primary Examiner* — Cynthia Hamilton
(74) *Attorney, Agent, or Firm* — Schmeiser, Olson & Watts; Joseph P. Abate

(57) ABSTRACT

Compositions characterized by the presence of an aqueous base-soluble polymer having aromatic moieties and aliphatic alcohol moieties have been found which are especially useful as developable bottom antireflective coatings in 193 nm lithographic processes. The compositions enable improved lithographic processes which are especially useful in the context of subsequent ion implantation or other similar processes where avoidance of aggressive antireflective coating removal techniques is desired.

21 Claims, No Drawings

OTHER PUBLICATIONS

Gu, Guerrero, Shao, "Taking the wet-developable route to applying BARC in implant layers", pp. 1-3, http://www.solid-state.com/articles/print.html?id=206472&bPool=SST.p.com., only date is submission date of Feb. 2, 2009.

Toukhy, Oberlander, Mullen, Lu, Neisser, Radiation Sensitive Developable Bottom Anti Reflective Coatings (DBARC) for 193nm Lithography, First Generation, 2007, pp. 1-8, AZ Electronic Materials USA Corp., Somerville, NJ., SPIE vol . 6519, 651936.

Houlihan, Dioses, Toukhy, Romano, Oberlander, Wu, Mullen, Krawicz, Lu, Nessier, "Implant Resist Approaches for 193nm Second Generation Radiation Sensitive Developable Bottom Anti-Reflective Coatings" 2007, pp. 359-364., Journal of Photopolymer Science and Technology, vol. 20, No. 3, pp. 359-364.

Houlihan, Miyazaki, Dioses, Zhang, Ubayashi, Ohta, Oberlander, Krawicz, Vasanthan, Li, Wei, Lu, Nessier, Approaches for 193nm and 248nm First and Second Generation Sensitive Developer Bottom Anti Reflective Coatings (DBARC), 2008, pp. 383-392., J of photopolymer science and Technology, vol. 21,No. 3, pp. 383-392.

\* cited by examiner

DEVELOPABLE BOTTOM ANTIREFLECTIVE COATING COMPOSITIONS ESPECIALLY SUITABLE FOR ION IMPLANT APPLICATIONS

BACKGROUND OF THE INVENTION

In the microelectronics industry as well as in other industries involving construction of microscopic structures (e.g. micromachines, magnetoresistive heads, etc.), there is a continued desire to reduce the size of structural features. In the microelectronics industry, the desire is to reduce the size of microelectronic devices and/or to provide greater amount of circuitry for a given chip size.

Effective lithographic techniques are essential to achieving reduction of feature sizes. Lithography impacts the manufacture of microscopic structures not only in terms of directly imaging patterns on the desired substrate, but also in terms of making masks typically used in such imaging. Typical lithographic processes involve formation of a patterned resist layer by patternwise exposing the radiation-sensitive resist to an imaging radiation. The image is subsequently developed by contacting the exposed resist layer with a material (typically an aqueous alkaline developer) to selectively remove portions of the resist layer to reveal the desired pattern. The pattern is subsequently transferred to an underlying material by etching the material in openings of the patterned resist layer or by ion implantation into the substrate at the spaces in the pattern corresponding to the removed portions. After the transfer is complete, the remaining resist layer is then typically removed.

For many lithographic imaging processes, the resolution of the resist image may be limited by anomalous effects associated with refractive index mismatch and undesired reflections of imaging radiation. High reflectivity from the substrate has become increasingly detrimental to the lithographic performance of photoresists for high NA and short UV wavelength (248 nm and 193 nm) exposures leading to undesirably high critical dimension (CD) variation on the wafer. This problem is even more pronounced in implant levels owing to the existance of topography (post gate level) and various reflective substrates (such as Si and $SiO_2$ in pregate levels). Top antireflective coatings (TARC) have been used earlier, but their reflectivity control is not as good as bottom antireflective coatings (BARC).

Using conventional BARC requires an etch step (e.g., reactive ion etching) to remove the BARC. There is a concern that such etch processes could damage the substrate. Thus, the use of conventional BARC in the lithography step is not desirable for many applications including implant levels.

Developable BARC (DBARC) has been proposed to solve the damage issues associated with conventional BARC removal.

U.S. Pat. No. 6,844,131 describes a positive-working photoimageable bottom antireflective coating. This patent teaches the use of a polymer containing an acid labile group in combination with an absorbing chromophore. US Published Patent Application 20070243484 discloses a wet developable bottom antireflective coating composition and method for use thereof. This application teaches the use of a polymer containing no acid labile group. Both patent publications require the casting solvents for their DBARCs be different from the resist solvents. In most cases, these DBARC compositions require ketones and lactones. Ketones and lactones are usually either not safe enough or not good for spin-coating (the method commonly used to form layers of photoresist materials and BARCs on semiconductor wafers).

Therefore, there is a need for improved DBARC compositions that are especially suitable for use in 193 nm lithographic processes to be followed by ion implantation which DBARCs use solvents that are more compatible with conventional photoresist processing and application techniques (e.g., propylene glycol methyl ether acetate or PGMEA).

SUMMARY OF THE INVENTION

The invention encompasses developable bottom antireflective coating (DBARC) compositions comprising a polymer containing pendant aromatic moieties and pendant aliphatic alcohol-containing moieties. These DBARC compositions are characterized by the ability to apply them to substrates using conventional spin-coating and conventional solvents commonly used for casting resist materials. The compositions are further characterized by their ability, upon adequate baking (e.g., above about 150° C.), to undergo little or no significant intermixing with the subsequently applied resist layer. Additionally, the DBARC compositions of the invention provide good reflectivity control (e.g., k value >0.15), good adhesion to substrate, upon adequate baking, and good dissolution properties in developer for the resist. The invention also encompasses methods of using such lithographic structures to pattern underlying material layers on a substrate.

In one aspect, the invention encompasses a developable bottom anti reflective coating composition comprising:
 (a) a polymer containing a backbone component, a pendant aromatic moiety and a pendant aliphatic alcohol moiety, wherein the polymer becomes substantially insoluble in a resist casting solvent if subsequently baked at a temperature greater than about 150° C., and
 (b) a solvent for the unbaked polymer.

The polymer of the invention may contain pendant acid labile groups. The polymer preferably has an ethylenic backbone. The DBARC composition may further contain a radiation-sensitive acid generator. The DBARC composition itself may be photoimageable or not.

In another aspect, the invention encompasses method of forming a patterned material feature on a substrate, the method comprising:
 (a) providing a material surface on a substrate,
 (b) forming a bottom antireflective coating over the material surface, the bottom antireflective coating of the invention,
 (c) baking said antireflective coating layer to render it substantially insoluble in casting solvent for a subsequent resist layer,
 (d) forming a resist layer over the bottom antireflective coating,
 (e) patternwise exposing the resist layer to radiation thereby creating a pattern of radiation-exposed regions in the resist layer,
 (f) selectively removing portions of the resist layer and antireflective coating to expose portions of the material surface by selective dissolution in an aqueous alkaline developer, and
 (g) etching or ion implanting the exposed portions of the material, thereby forming the patterned material feature.

Step (g) preferably consists of ion implanting in the exposed portions. The imaging radiation is preferably 193 nm radiation.

These and other aspects of the invention are discussed in further detail below.

DETAILED DESCRIPTION OF THE INVENTION

The invention encompasses developable bottom antireflective coating (DBARC) compositions comprising a polymer containing pendant aromatic moieties and pendant aliphatic alcohol-containing moieties. These DBARC compositions are characterized by the ability to apply them to substrates using conventional spin-coating and conventional solvents commonly used for casting resist materials. The compositions are further characterized by their ability, upon adequate baking (e.g., above about 150° C.), to undergo little or no significant intermixing with the subsequently applied resist layer. Additionally, the DBARC compositions of the invention provide good reflectivity control (e.g., k value >0.15), good adhesion to substrate, upon adequate baking, and good dissolution properties in developer for the resist. The invention also encompasses methods of using such lithographic structures to pattern underlying material layers on a substrate.

The polymer of the DBARC preferably has an ethylenic backbone. More preferably, the polymer contains vinyl, acrylate and/or methacrylate repeating units.

The polymer preferably contains a first repeating unit having the structure:

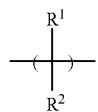

where $R^1$ is selected from H, F, Br, $CF_3$, CN and $CH_3$ and $R^2$ includes an aromatic moiety. The aromatic moieties are preferably independently selected from the group consisting of substituted or unsubstituted aromatic moieties or combinations thereof. More preferably, aromatic moieties are selected from the group consisting of benzene, naphthalene, anthracene, phenanthrene, pyrene, coronene and combinations thereof. The polymer preferably contains about 10 to 80 mole % of repeating units having aromatic moieties, more preferably about 15-70 mole %, most preferably about 20-65 mole %.

Examples of specific first repeating units are derived from one of the following structures:

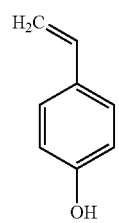

(I)

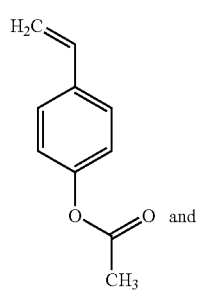

(II)

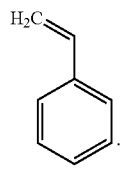

(III)

The polymer preferably contains a second repeating unit having the structure:

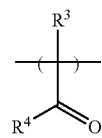

where $R^3$ is selected from H, F, Br, $CF_3$, CN and $CH_3$, $R^4$ includes an aliphatic alcohol moiety. The aliphatic alcohol moieties are preferably independently selected from the group consisting of linear, branched, and cycloaliphatic alcohols and combinations thereof. More preferably, the aliphatic alcohol moieties are selected from hydroxyadamantyl moieties, hydroxycyclohexyl, hydroxynorbornyl and hydroxyethyl moieties. The polymer preferably contains about 10 to 80 mole % of repeating units having aliphatic alcohol moieties, more preferably about 20-70 mole %, most preferably about 25-65 mole %.

Examples of specific second repeating units are derived from one of the following structures:

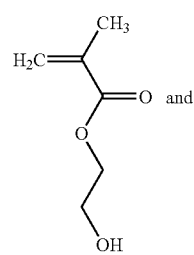

(IV)

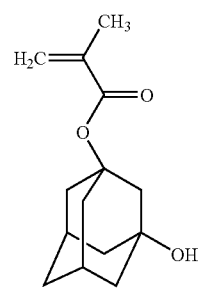

(V)

The invention also encompasses photoimageable DBARC compositions where the polymer preferably further includes third repeating units derived from a monomer which includes acid-labile pendant moieties, such as tertiary alkyl carbonates, tertiary alkyl esters, tertiary alkyl ethers, acetals, and ketals. Some examples of such a monomer including a tertiary alkyl ester are shown below:

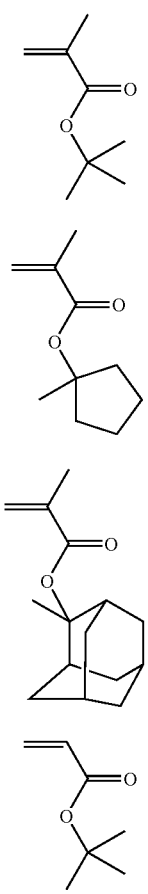
(VI)
(VII)
(VIII)
(IX)
(X)
(XI)
(XII)
-continued
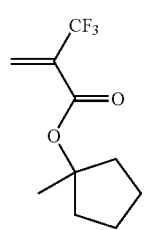
(XIII)
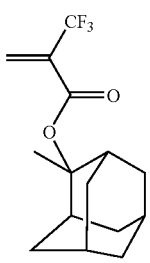
(XIV)
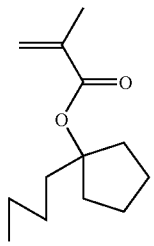
(XV)
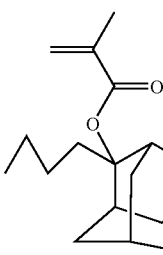
(XVI)
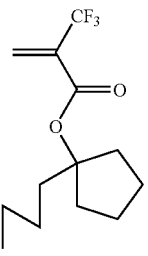
(XVII)
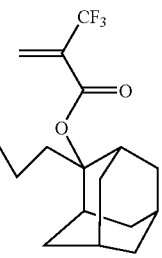
(XVIII)

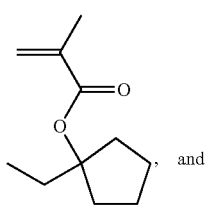
(XIX)

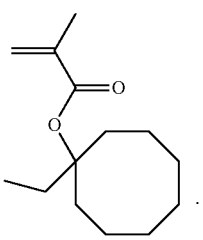
(XX)

The DBARC compositions of the invention are not limited to any specific form of the third repeating unit. The DBARC polymer preferably includes about 10-65 mole % of the third repeating unit, more preferably about 15-50 mole %.

Some example DBARC polymers of the invention are described in the table below where the numbers indicate mole percent of repeating unit:

| Sample name | Aromatic repeating unit | Acid labile repeating unit | Aliphatic alcohol repeating unit |
|---|---|---|---|
| WS-1 | 45 (HS) | 40 (MAdMA) | 15 (HAdMA) |
| WS-2 | 45 (HS) | 40 (ECpMA) | 15 (HAdMA) |
| WS-3 | 40 (HS) | 35 (ECpMA) | 25 (HAdMA) |
| WS-4 | 50 (HS) | 25 (ECpMA) | 25 (HAdMA) |
| WS-5 | 50 (AcOSt) | 25 (ECpMA) | 25 (HAdMA) |
| WS-6 | 40 (HS) | 25 (ECpMA) | 35 (HAdMA) |
| WS-7 | 50 (HS) | 25 (ECpMA) | 25 (HAdMA) |
| WS-8 | 30 (HS) | 30 (ECpMA) | 40 (HAdMA) |
| WS-9 | 25 (HS) | 30 (ECpMA) | 45 (HAdMA) |
| WS-10 | 30 (HS) | 20 (ECpMA) | 50 (HAdMA) |
| WS-11 | 30 (HS) | 25 (EAdMA) | 45 (HAdMA) |
| WS-12 | 30 (ST) | 35 (ECpMA) | 35 (HAdMA) |
| WS-13 | 30 (ST) | 35 (EAdMA) | 35 (HAdMA) |
| WS-14 | 30 (ST) | 30 (ECpMA) | 40 (HEMA) |
| W-15 | 30 (HS) | 25 (MAdMA) | 45 (HAdMA) |
| WS-16 | 30 (HS) | 10 (MAdMA) 15 (ECpMA) | 45 (HAdMA) |
| WS-17 | 30 (HS) | 25 (TBA) | 45 (HAdMA) |
| WS-18 | 30 (HS) | 25 (MCpMA) | 45 (HAdMA) |
| S-1 | 85 (HS) | | 15 (HAdMA) |

HS = 4-hydroxystyrene (structure I)
AcOSt = 4-Acetoxystyrene (structure II)
ST = styrene (structure III)
MAdMA = MethylAdamantylMethacrylate (structure VIII)
EAdMA = EthylAdamantylMethacrylate (structure XXI)
ECpMA = EthylCyclopentylMethacrylate (structure XIX)
MCpMA = MethylCyclopentylMethacrylate (structure VII)
TBA = tert-ButylAcrylate (structure VI)
HAdMA = HydroxyAdamantylMethacrylate (structure V)
HEMA = HydroxyEthylMethacrylate (structure IV)

The DBARC compositions of the invention preferably have an extinction coefficient k of about >0.15 with respect to a radiation wavelength of 193 nm.

The DBARC polymers of the invention preferably have a weight average molecular weight of at least about 1000, more preferably a weight average molecular weight of about 1500-50000, most preferably about 8000 to 15000. The polymers of the invention may be made by conventional polymerization techniques using commercially available and/or easily synthesized monomers. If desired, blends of different polymers of the invention may be used.

The invention also encompasses photoimageable DBARC compositions where the composition preferably contains a radiation sensitive acid generator.

The radiation sensitive acid generators, also known as photoacid generators, used in the photoresist composition of the invention are compounds that generate an acid upon exposure to radiation. Any suitable photoacid generating agent may be used, so long as the resulting DBARC composition dissolves sufficiently in the casting solvent and the resulting solution thereof forms a suitably uniform film by a film-forming process, such as spin coating or the like. Some examples of classes of photoacid generators that may be employed in the DBARC compositions of the invention are: onium salts, succinimide derivatives, diazo compounds, nitrobenzyl compounds, and the like. The photoacid generators may be used singly or in a mixture of two or more.

Some preferred photoacid generators are onium salts, such as an iodonium salt or a sulfonium salt, and/or a succinimide derivative. More preferred photoacid generators include 4-(1-butoxynaphthyl) tetrahydrothiophenium perfluorobutanesulfonate, triphenyl sulfonium perfluorobutanesulfonate, t-butylphenyl diphenyl sulfonium perfluorobutanesulfonate, 4-(1-butoxynaphthyl) tetrahydrothiophenium perfluorooctanesulfonate, triphenyl sulfonium perfluorooctanesulfonate, t-butylphenyl diphenyl sulfonium perfluorooctanesulfonate, di(t-butylphenyl) iodonium perfluorobutane sulfonate, di(t butylphenyl) iodonium perfluorohexane sulfonate, di(t-butylphenyl) iodonium perfluoroethylcyclohexane sulfonate, di(t-butylphenyl)iodonium camphorsulfonate, and perfluorobutylsulfonyloxybicylo[2.2.1]-hept-5-ene-2,3-dicarboximide.

The compositions of the invention may further comprise at least one solvent. Suitable solvents include, but are not limited to: PGMEA, ethyl lactate, ethyl 3-ethoxypropionate, cyclohexanone, 1-butanol, methanol, ethanol, 1-propanol, ethylene glycol, 1,2-butanediol, 1,3-butanediol, 1,4-butanediol, 1,2-propanediol, 1-pentanol, 2-pentanol, 3-pentanol, 1-hexanol, 2-hexanol, 3-hexanol, 1-heptanol, 2-heptanol, 3-heptanol, 4-heptanol, 2-methyl-1-pentanol, 2-methyl-2- pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2,4-dimethyl-3-pentanol, 3-ethyl-2-pentanol, 1-methylcyclopentanol, 2-methyl-1-hexanol, 2-methyl-2-hexanol, 2-methyl-3-hexanol, 3-methyl-3-hexanol, 4-methyl-3-hexanol, 5-methyl-1-hexanol, 5-methyl-2-hexanol, 5-methyl-3-hexanol, 4-methylcyclohexanol, 1,3-propanediol, octanol, and decane. The composition may further comprise small portion of second or third solvent to form a mixed solvent. Suitable second or third solvents include, but not limited to: γ-butyrolactone, anisole, propylene carbonate, sulfolane, dimethyl succinate, and dimethyl adipate. Preferably, the solvent is one used for casting of resist formulations. The amount of solvent in the composition for application to a substrate is preferably sufficient to achieve a solids content of about 0.5-5 wt. %. The compositions may include surfactants, acid quenchers or other expedients known in the art.

The invention encompasses methods of forming a patterned material feature on a substrate, the method comprising:
(a) providing a material surface on a substrate,
(b) forming a bottom antireflective coating over the material surface, the bottom antireflective coating comprising
a polymer containing a backbone component, a pendant aromatic moiety and a pendant aliphatic alcohol moiety, wherein the polymer becomes substantially insoluble in a resist casting solvent if subsequently baked at a temperature greater than about 150° C., and
(a) a solvent for the unbaked polymer,
(b) baking the antireflective coating layer to render it substantially insoluble in casting solvent for a subsequent resist layer,
(c) forming a resist layer over the bottom antireflective coating,
(d) patternwise exposing the resist layer to radiation thereby creating a pattern of radiation-exposed regions in the resist layer,
(e) selectively removing portions of the resist layer and antireflective coating to expose portions of the material surface by selective dissolution in an aqueous alkaline developer, and
(f) etching or ion implanting the exposed portions of the material, thereby forming the patterned material feature.

The material surface of the semiconductor substrate may be a metal conductor layer, a ceramic insulator layer, a semiconductor layer or other material depending on the stage of the manufacture process and the desired material set for the end product. The compositions of the invention are especially useful for lithographic processes used in the manufacture of integrated circuits on semiconductor substrates. The compositions of the invention in lithographic processes to create patterned material layer structures such as metal wiring lines, holes for contacts or vias, insulation sections (e.g., damascene trenches or shallow trench isolation), trenches for capacitor structures, ion implanted Si structures for transistors, etc. as might be used in integrated circuit devices.

The DBARC compositions of the invention preferably will substantially reduce the substrate reflectivity with respect to 193 nm radiation. The DBARC composition of the invention is preferably applied directly over the material surface by spin-coating. The DBARC is then baked for a time and temperature sufficient to remove any solvent in the DBARC composition and to render the DBARC composition substantially insoluble in the solvent used to apply the subsequent resist layer. The baking temperature is preferably about 110° C. or higher, more preferably about 150° C. to 250° C. The bake time is preferably about 30 seconds to 5 minutes, more preferably about 1 to 2 minutes. For DBARCs containing acid labile groups, overbaking would result in a substantial deprotection of the polymers and would then become largely or completely dissolved away in the develop process to form the undesired undercut profiles or collapsed images. Overbaking may in some instances create insoluble component such as to form residues after develop process. Preferably, overbaking such as would hinder solubility of the DBARC in aqueous base developer is avoided.

The resist is preferably imageable with 193 nm ultraviolet radiation. Examples of suitable resist materials are described in US Published Patent Application Nos. 20050153232A1 and 20040063024A1 and U.S. Pat. Nos. 6,902,874, 6,730,452, 6,627,391, 6,635,401 and 6,756,180 the disclosures of which are incorporated herein by reference. Typically, the solvent-containing resist composition is applied using spin coating or other technique. The substrate with the resist coating is then preferably heated (pre-exposure baked) to remove the solvent and improve the coherence of the resist layer. The pre-exposure bake step is preferably conducted for about 10 seconds to 15 minutes, more preferably about 15 seconds to one minute. The pre-exposure bake temperature may vary depending on the glass transition temperature of the resist.

If desired, a top antireflective coating may be applied to the substrate after formation of the resist layer according to conventional techniques.

The resist layer is then patternwise-exposed to the desired radiation (e.g. 193 nm ultraviolet radiation). The patternwise exposure is conducted through a mask which is placed over the resist layer. For 193 nm UV radiation, the total exposure energy is preferably about 100 millijoules/cm$^2$ or less, more preferably about 50 millijoules/cm$^2$ or less (e.g. 15-30 millijoules/cm$^2$).

After the desired patternwise exposure, the resist layer is typically baked to further complete the acid-catalyzed reaction and to enhance the contrast of the exposed pattern. The post-exposure bake is preferably conducted at about 60-175° C., more preferably about 90-160° C. The post-exposure bake is preferably conducted for about 30 seconds to 5 minutes.

After post-exposure bake, if any, the resist structure with the desired pattern is obtained (developed) by contacting the resist layer with an aqueous alkaline developer solution which selectively dissolves the areas of the resist which were exposed to radiation in the case of a positive resist (or the unexposed areas in the case of a negative resist). The DBARC in the area of the dissolved resist is also removed by dissolution in the aqueous base developer solution. Preferred aqueous base developer solutions are aqueous solutions of tetramethyl ammonium hydroxide. The resulting lithographic structure on the substrate is then typically dried to remove any remaining developer.

The pattern from the resist structure may then be transferred to the exposed portions of underlying material of the substrate by etching with a suitable etchant using techniques known in the art (e.g., reactive ion etching or wet etching) or by ion implantation in the exposed portions. The invention is especially useful where the pattern transfer is performed by ion implantation (e.g., dopant implantation to form source/drain features in semiconductor materials). Once the desired pattern transfer has taken place, any remaining resist may be removed using conventional stripping techniques.

Examples of general lithographic processes where the composition of the invention may be useful are disclosed in U.S. Pat. Nos. 4,855,017; 5,362,663; 5,429,710; 5,562,801; 5,618,751; 5,744,376; 5,801,094; 5,821,469 and 5,948,570, the disclosures of which patents are incorporated herein by reference. Other examples of pattern transfer processes are described in Chapters 12 and 13 of "Semiconductor Lithography, Principles, Practices, and Materials" by Wayne Moreau, Plenum Press, (1988), the disclosure of which is incorporated herein by reference. It should be understood that the invention is not limited to any specific lithography technique or device structure.

The invention is further described by the examples below. The invention is not limited to the specific details of the examples.

EXAMPLE 1

Synthesis of terpolymers of 4-hydroxystyrene, 1-ethylcyclopentyl methacrylate, and 3-hydroxy-1-adamantyl methacrylate (HS/ECpMA/HAdMA(30/20/50)) (WS-10)

To a round bottom flask equipped with condenser, thermometer, an argon (Ar) inlet, and a magnetic stirrer bar, the following were added: 4-acetoxystyrene monomer (2.43 grams (g), 0.015 mole), 1-ethylcyclopentyl methacrylate monomer (1.82 g, 0.01 mole), 3-hydroxy-1-adamantyl methacrylate monomer (5.91 g, 0.025 mole), 2,2'-azobis(2-methylpropionitrile) (AIBN)(0.41 g, 5% of total moles of monomers), and approximately 40 g of tetrahydrofuran (THF). The reaction mixture was stirred at room temperature and bubbled with Ar flow for 45 minutes before it was heated. The reaction was carried out overnight at 72° C. under an inert Ar atmosphere. The reaction solution was then cooled to room temperature and approximately 20 g of THF was blown away by a high flow of nitrogen bubbling into the flask. To the remaining reaction solution, 18 g of methanol and approximately 4 g (excess) of concentrated NH$_4$OH were added and the reaction was carried out at 65° C. overnight. The solution was then cooled to room temperature, and small portion of the reaction mixture was removed for C$^{13}$ NMR test. The mixture was added in with equivalent of deuterated acetone for this test. After the confirmation of complete deprotection of acetoxy group (the disappearance of 121 ppm peak), the reaction solution was then added dropwise into a mixture of water (1000 ml)) and glacial acetic acid (30 ml). The precipitated polymer was separated, rinsed with water (2×300 ml) and dried in a vacuum oven at 65° C. for a short time. The polymer was re-dissolved in acetone and re-precipitated in a mixture of water (1000 ml) and glacial acetic acid (30 ml). The solid was filtered with a frit funnel, washed with water (2×300 ml) and dried in a vacuum oven at 65° C. for 24 hours.

EXAMPLE 2

Synthesis of terpolymers of 4-hydroxystyrene, t-butyl acrylate, and 3-hydroxy-1-adamantyl methacrylate (HS/TBA/HAdMA(30/25/45)) (WS-17)

To a round bottom flask equipped with condenser, thermometer, an argon (Ar) inlet, and a magnetic stirrer bar, the following were added: 4-acetoxystyrene monomer (2.43 grams (g), 0.015 mole), t-butyl acrylate monomer (1.6 g, 0.0125 mole), 3-hydroxy-1-adamantyl methacrylate monomer (5.319 g, 0.0225 mole), 2,2'-azobis(2-methylpropionitrile) (AIBN)(0.328 g, 4% of total moles of monomers), and approximately 40 g of tetrahydrofuran (THF). The reaction mixture was stirred at room temperature and bubbled with Ar flow for 45 minutes before it was heated. The reaction was carried out overnight at 72° C. under an inert Ar atmosphere. The rest of the synthetic procedures are the same as Example 1, except approximately 5 g of concentrated NH$_4$OH was used in deprotecting the acetoxy groups from acetoxystyrene repeat units to form hydroxyl styrene repeat units of the terpolymer.

EXAMPLE 3

Patterning of HS/ECpMA/HAdMA(30/20/50) Polymer

Formulation was prepared by dissolving 100 mg of polymer prepared in EXAMPLE 1 and 5 mg of TPS PFBuS in 4-methyl-2-pentanol. It was then filtered through 0.2 µm PTFE filter and spincoated onto a clean silicon wafer at about 1500 RPM. The wafer was then baked at 180° C. for 60 sec. Subsequently the wafer was coated with a ArF photoresist and imaged using binary mask in a ArF stepper. The wafer was baked at 100° C. and developed in a standard 0.26N developer. The X-SEM of printed pattern for 135 nm lines/spaces showed improved sidewall profile compared to images created without use of the DBARC of the invention.

EXAMPLE 4

Patterning of HS/TBA/HAdMA(30/25/45) Polymer

Formulation was prepared by dissolving 100 mg of polymer prepared in EXAMPLE 2 and 5 mg of TPS PFBuS in 4-methyl-2-pentanol. It was then filtered through 0.2 µm PTFE filter and spin-coated onto a clean silicon wafer at about 1500 RPM. The wafer was then baked at 180° C. for 60 sec. Subsequently the wafer was coated with a ArF photoresist and imaged using binary mask in a ArF stepper. The wafer was baked at 110° C. and developed in a standard 0.26N developer. The X-SEM of printed pattern for 135 nm lines/spaces showed improved sidewall profile compared to images created without use of the DBARC of the invention.

EXAMPLE 5

Aqueous base test of baked HS-HAdMA(85/15) (S1) copolymer

A HS-HAdMA(85/15) Copolymer was prepared in the manner described in Example 1. The copolymer was spin coated onto a substrate using a casting solvent of 2% GBL and 98% PGMEA. The sample was then baked at 185° C. for 1 minute. The resulting film was then contacted with an aqueous alkaline developer for 60 seconds which resulted in complete dissolution of the baked DBARC.

What is claimed is:

1. A developable bottom antireflective coating composition comprising:
   (a) a polymer containing a backbone component, a pendant aromatic moiety, a pendant aliphatic alcohol moiety, and a pendant acid labile moiety, wherein said polymer becomes substantially insoluble in a resist casting solvent if subsequently baked at a temperature greater than about 150° C., and
   (b) a solvent for said unbaked polymer, wherein said polymer comprises a first repeating unit having the structure:

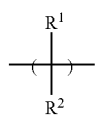

wherein R$^1$ is selected from F, Br, CF$_3$, CN and CH$_3$ and R$^2$ includes an aromatic moiety.

2. The composition of claim 1 further comprising (c) a radiation-sensitive acid generator.

3. The composition of claim 1 wherein said backbone component is an ethylenic backbone.

4. The composition of claim 1 wherein said polymer comprises a second repeating unit having the structure:

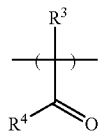

wherein $R^3$ is selected from H, F, Br, $CF_3$, CN and $CH_3$, $R^4$ includes an aliphatic alcohol moiety.

5. The composition of claim 4 wherein said polymer comprises a third repeating unit, said third repeating unit having said acid labile moiety.

6. The composition of claim 5 wherein said polymer has 15-70 mole % of said first repeating unit, 20-70 mole % of said second repeating unit, and 10-65 mole % of said third repeating unit.

7. The composition of claim 4 wherein said aliphatic alcohol moieties are selected from the group consisting of linear, branched, and cycloaliphatic alcohols and combinations thereof.

8. The composition of claim 7 wherein said polymer comprises cycloaliphatic alcohol moieties.

9. The composition of claim 8 wherein said cycloaliphatic alcohol moieties are hydroxyadamantyl moieties.

10. The composition of claim 4 wherein said polymer consists essentially of said repeating units.

11. The composition of claim 1 wherein said aromatic moieties are selected from the group consisting of benzene, naphthalene, anthracene, phenanthrene, pyrene, coronene and combinations thereof.

12. The composition of claim 1 wherein said solvent for said unbaked polymer is selected from the group consisting of propylene glycol methyl ether acetate, 4-methyl-2-pentanol, cyclohexanone, ethyl lactate, ethyl 3-ethoxypropionate.

13. The composition of claim 1 wherein if said polymer is subsequently baked at a temperature greater than about 150° C., said polymer becomes substantially insoluble in said resist casting solvent while being soluble in an aqueous alkaline developer.

14. A developable bottom antireflective coating composition comprising:
 (a) a polymer containing a backbone component, a pendant aromatic moiety, a pendant aliphatic alcohol moiety, and a pendant acid labile moiety, wherein said polymer becomes substantially insoluble in a resist casting solvent if subsequently baked at a temperature greater than about 150° C., and
 (b) a solvent for said unbaked polymer, wherein said polymer has a weight average molecular weight of about 1500-50000.

15. A method of forming a patterned material feature on a substrate, said method comprising:
 (a) providing a material surface on a substrate,
 (b) forming a bottom antireflective coating over said material surface, said bottom antireflective coating comprising
  (i) a polymer containing a backbone component, a pendant aromatic moiety, a pendant aliphatic alcohol moiety, and a pendant acid labile moiety, wherein said polymer becomes substantially insoluble in a resist casting solvent if subsequently baked at a temperature greater than about 150° C., and
  (ii) a solvent for said unbaked polymer,
 (c) baking said antireflective coating layer to render it substantially insoluble in casting solvent for a subsequent resist layer,
 (d) forming a resist layer over said bottom antireflective coating,
 (e) patternwise exposing said resist layer to radiation thereby creating a pattern of radiation-exposed regions in said resist layer,
 (f) selectively removing portions of said resist layer and antireflective coating to expose portions of said material surface by selective dissolution in an aqueous alkaline developer, and
 (g) etching or ion implanting said exposed portions of said material, thereby forming said patterned material feature.

16. The method of claim 15 wherein said antireflective coating further comprises (iii) a radiation-sensitive acid generator.

17. The method of claim 15 wherein said resist casting solvent is propylene glycol methyl ether acetate.

18. The method of claim 15 wherein said radiation is ultraviolet radiation having a wavelength of about 193 nm.

19. The method of claim 15 wherein after said baking, remaining steps of said method of forming said patterned material feature consist of: said forming said resist layer over said bottom antireflective coating, said patternwise exposing said resist layer to radiation, said selectively removing portions of said resist layer and antireflective coating to expose portions of said material surface by selective dissolution in said aqueous alkaline developer, and said etching or ion implanting said exposed portions of said material.

20. The method of claim 15 wherein said pendant acid labile moiety is selected from the group consisting of MethylAdamantylMethacrylate, EthylAdamantylMethacrylate, EthylCyclopentylMethacrylate, MethylCyclopentylMethacrylate, and tert-ButylAcrylate.

21. A developable bottom antireflective coating composition comprising:
 (a) a polymer containing a backbone component, a pendant aromatic moiety, a pendant aliphatic alcohol moiety, and a pendant acid labile moiety, wherein said polymer becomes substantially insoluble in a resist casting solvent if subsequently baked at a temperature greater than about 150° C., and
 (b) a solvent for said unbaked polymer, wherein said pendant acid labile moiety is selected from the group consisting of MethylAdamantylMethacrylate, EthylAdamantylMethacrylate, EthylCyclopentylMethacrylate, MethylCyclopentylMethacrylate, and tert-ButylAcrylate.

* * * * *